United States Patent [19]
Fredrickson

[11] Patent Number: 5,757,826
[45] Date of Patent: May 26, 1998

[54] WORD-WISE PROCESSING FOR REED-SOLOMON CODES

[75] Inventor: Lisa Fredrickson, Ojai, Calif.

[73] Assignee: Quantum Corporation, Milpitas, Calif.

[21] Appl. No.: 501,329

[22] Filed: Jul. 12, 1995

[51] Int. Cl.$^6$ .................................................. H03M 13/00
[52] U.S. Cl. .................................. 371/37.11; 371/37.01;
371/37.5; 371/37.6; 371/37.7; 371/38.1;
371/40.1
[58] Field of Search ........................... 371/37.1, 37.5,
371/37.6, 37.7, 38.1, 40.1

[56] References Cited

U.S. PATENT DOCUMENTS

| | | | |
|---|---|---|---|
| 4,413,340 | 11/1983 | Odaka et al. | 371/39 |
| 4,680,764 | 7/1987 | Suzuki et al. | 371/37.5 |
| 4,777,635 | 10/1988 | Glover | 371/40 |
| 5,140,596 | 8/1992 | Weldon, Jr. | 371/37.5 X |
| 5,241,546 | 8/1993 | Peterson et al. | 371/37.1 |
| 5,383,204 | 1/1995 | Gibbs et al. | 371/37.7 |
| 5,422,895 | 6/1995 | Nguyen et al. | 371/37.5 |
| 5,471,485 | 11/1995 | Tong | 371/37.1 |

*Primary Examiner*—Reba I. Elmore
*Assistant Examiner*—McDieunel Marc

*Attorney, Agent, or Firm*—David B. Harrison; Debra A. Chun

[57] ABSTRACT

A word-wise encoder circuit that processes word formatted data blocks in response to a word clock signal and generates redundancy in accordance with an 8 bit symbol code. The encoder is provided with two parallel data paths, each receiving one of the respective bytes halves of the received data words during one word clock period to implement an 8 bit symbol code in response to a word clock signal. The word-wise encoder replicates, in one word clock period, the state of the registers in a standard sequential encoder after two consecutive bytes have been processed in response to a byte clock. In a preferred embodiment, a word-wise encoder is used to implement a Reed-Solomon data integrity code. In this example, the word-wise encoder generates redundancy that is appended to associated data blocks temporarily stored in a block buffer memory within a data channel to provide a mechanism for detecting data errors caused by the buffer. A reduced hardware implementation of a word-wise encoder circuit is disclosed wherein a special choice of generator polynomial and Galois field representation allows a Galois field multiplier to be eliminated. In this embodiment, the encoder generates two bytes of redundancy per data block and the longest propagation path in the encoder traverses one multiplier and two adders.

18 Claims, 5 Drawing Sheets

WRITE PATH 5,757,826

WORD-WISE PROCESSING FOR REED-SOLOMON CODES

FIELD OF THE INVENTION

The present invention pertains generally to the field of data coding methods and apparatus to protect blocks of data from erroneous transmission in a data communication and storage system. More specifically, the present invention pertains to a word-wise systematic encoder that encodes blocks of data received in synchronization with a word clock signal according to a byte wise symbol code by processing the two data bytes that comprise each data word in parallel over one word clock cycle to replicate the register states of a standard sequential encoder after two bytes have been processed in response to a byte clock signal.

BACKGROUND OF THE INVENTION

In digital data communication and storage systems, it is desirable to maintain the integrity of user data from the beginning to the end of the data channel. With respect to magnetic recording systems, in addition to providing a reliable read/write process to and from a data degrading storage medium, it is also desirable to maintain data integrity at points in the channel prior to the actual transducer head/medium interface.

Error detection and correction techniques typically rely on some form of appended redundancy information to protect data blocks from errors during transmission through a noisy communication or recording channel. This appended redundancy is generated from, and thus dependent upon, the precise bit pattern that forms the data block to be protected. The integrity of the data at a receiving end is checked by regenerating the redundancy from the received data block (using the same coding algorithm used to generate the redundancy at the transmission end) and then comparing the regenerated redundancy with the originally appended redundancy. After this comparison, if data errors are determined to be present, a request can be made to re-transmit or re-read the data, or, in the case of codes having error correction capabilities, to physically correct the data errors.

In modern magnetic storage systems, a main error correction code ("ECC") is typically used to detect and correct errors in data blocks that occur during the processes of reading and writing data to and from a storage surface of the magnetic medium itself. A cross-check code ("XCHK"), which typically utilizes a different encoding algorithm, has been used to check that any corrections carried out by the ECC are properly performed. An example of a disk drive data storage system that implements an ECC and XCHK to perform on-the-fly error correction is disclosed in commonly assigned U.S. Pat. No. 5,241,546 to Peterson et al., entitled "On-The-Fly Error Correction With Embedded Digital Controller." In commonly assigned U.S. Pat. No. 5,422,895, to Nguyen et al., entitled "Cross-Checking For On-The-Fly Reed-Solomon Error Correction Code," an improved cross-checking code and strategy is disclosed.

In these patents, the disclosure of which is hereby incorporated by reference, the combination of ECC with cross-checking reduces the statistical probability of ECC miscorrection for a given ECC coding strategy. The ECC and cross-check codes, however, are limited in operation to the detection and correction of errors that are associated with the storage of information on the degrading storage medium.

In commonly assigned, copending U.S. patent application Ser. No. 08/497,488 entitled, "Method And Apparatus To Protect Data Within A Disk Drive Buffer," filed on Jun. 30, 1995, an architecture for protecting data in a block buffer memory that utilizes the ECC's cross-check code as a data integrity code is disclosed. In that application, the disclosure of which is hereby incorporated by reference in its entirety, the same cross-check code used to detect miscorrections by the ECC is preferably implemented in the host interface circuitry and provides the capability to perform data integrity checking through the block memory buffer in both the read and write paths of a data channel. The data integrity code architecture disclosed in that application replaces less powerful parity check and cyclical redundancy codes that have been used to protect block memory buffers in the past.

The implementation of such a code, however, has been problematic in systems that do not have ready access to a clock which corresponds to the symbol period of the code that is to be utilized. For example, in the case of applications which utilize an 8 bit Reed-Solomon symbol code over a 256 element Galois field, $GF(2^8)$, a byte clock has been needed to sequentially clock data bytes through a conventional sequential encoder, such as the one shown in FIG. 3. Thus, the use of N bit Reed-Solomon symbol codes has been difficult in applications that do not have ready access to a clock signal which corresponds to the N bit symbol code in that portion of the data path for which coding protection is sought.

Accordingly, it would be desirable to provide a circuit implementation for a symbol oriented Reed-Solomon in an environment where only a word clock is available. The term "word" is used herein to refer to a bit string of twice the symbol size. Thus, for a symbol size of 8 bits (i.e., a byte) the word length would be 16 bits, and a 10 bit symbol code would have a word length of 20 bits. A particularly desirable aspect of such an implementation would be the ability to process two data symbols at a time in parallel and in synchronization with a word clock so as to adapt an N bit Reed-Solomon symbol code to function with a word clock (i.e., having a period of 2N). It would also be desirable to implement such a Reed-Solomon code with reduced hardware complexity and minimized critical path lengths.

SUMMARY OF THE INVENTION

A general object of the present invention is to provide a symbol length code and corresponding encoder circuit that implements the same in response to a word clock signal.

Another object of the present invention is to provide a Reed-Solomon encoder for encoding data blocks according to an 8-bit Reed-Solomon code wherein the encoder receives data blocks as a series of data words in response to a word clock signal.

Another object of the present invention is to provide a encoder for a Reed-Solomon data integrity code that operates on two data symbols at a time during a single word clock period to mimic the state of a sequential encoder after two consecutive symbol periods.

Yet another object of the invention is to provide a Reed-Solomon encoder for processing data words as first and second data bytes in parallel over corresponding first and second parallel inputs during a single word clock period, wherein the encoder produces two bytes of Reed-Solomon redundancy according to a byte length code for each data block to be protected.

Another object of the present invention is to provide a parallel input architecture of the above character wherein one multiplier is eliminated to minimize the number of multiplies in the critical path and reduce the overall delay through the Reed-Solomon encoder/detector.

3

A more specific object of the present invention is to provide a hardware minimized architecture of the above character wherein the longest propagation path in the Reed-Solomon encoder/detector traverses one multiplier and two adders.

Another more specific object of the present invention is to provide a Reed-Solomon word-wise encoder for encoding blocks of data, wherein the encoder utilizes the generator polynomial $g(x)=z^2-z+\alpha^{206}$, and operates over GF(256) defined by a Galois field generator polynomial $p(x)=x^8+x^4+x^3+x^2+1$, and having a primitive alpha element equal to 02x (hexadecimal).

In accordance with these and other objects, features, and aspects of the present invention, a symbol length Reed-Solomon code and a word-wise systematic encoder circuit for implementing same are provided wherein the encoder receives word formatted data blocks in synchronization with a word clock signal, and generates redundant information based on the received data block according to a symbol length code.

In a preferred embodiment, a word-wise encoder is provided with two parallel data paths, each receiving one of the respective bytes halves of the received data words during one word clock period to implement an 8 bit symbol code in an environment where only a word clock signal is available. The preferred encoder replicates, in one word clock period, the state of a standard sequential input encoder after two consecutive bytes have been processed over two byte clock cycles.

In a preferred application of a word-wise encoder according to the invention, a data integrity code is implemented that protects blocks of data temporarily stored in a block buffer memory array during transmission through a data channel. The disclosed data integrity code has an 8 bit symbol size and generates two redundant bytes (r=2) for each block of data to be protected. In a presently preferred code, a special choice of generator polynomial and Galois field representation provides for a reduced hardware implementation allowing the $g_1$ multiplier in the r=2 encoder to be eliminated. The longest propagation path in the Reed-Solomon encoder for this code traverses only one multiplier and two adders.

These and other aspects, features, objects and advantages of the present invention will be more fully understood and appreciated upon consideration of the following detailed description of a preferred embodiment of the invention, presented in conjunction with the accompanying drawings, wherein like numerals designate corresponding parts in the several figures.

DETAILED DESCRIPTION OF A PREFERRED EMBODIMENT

Figure 1:
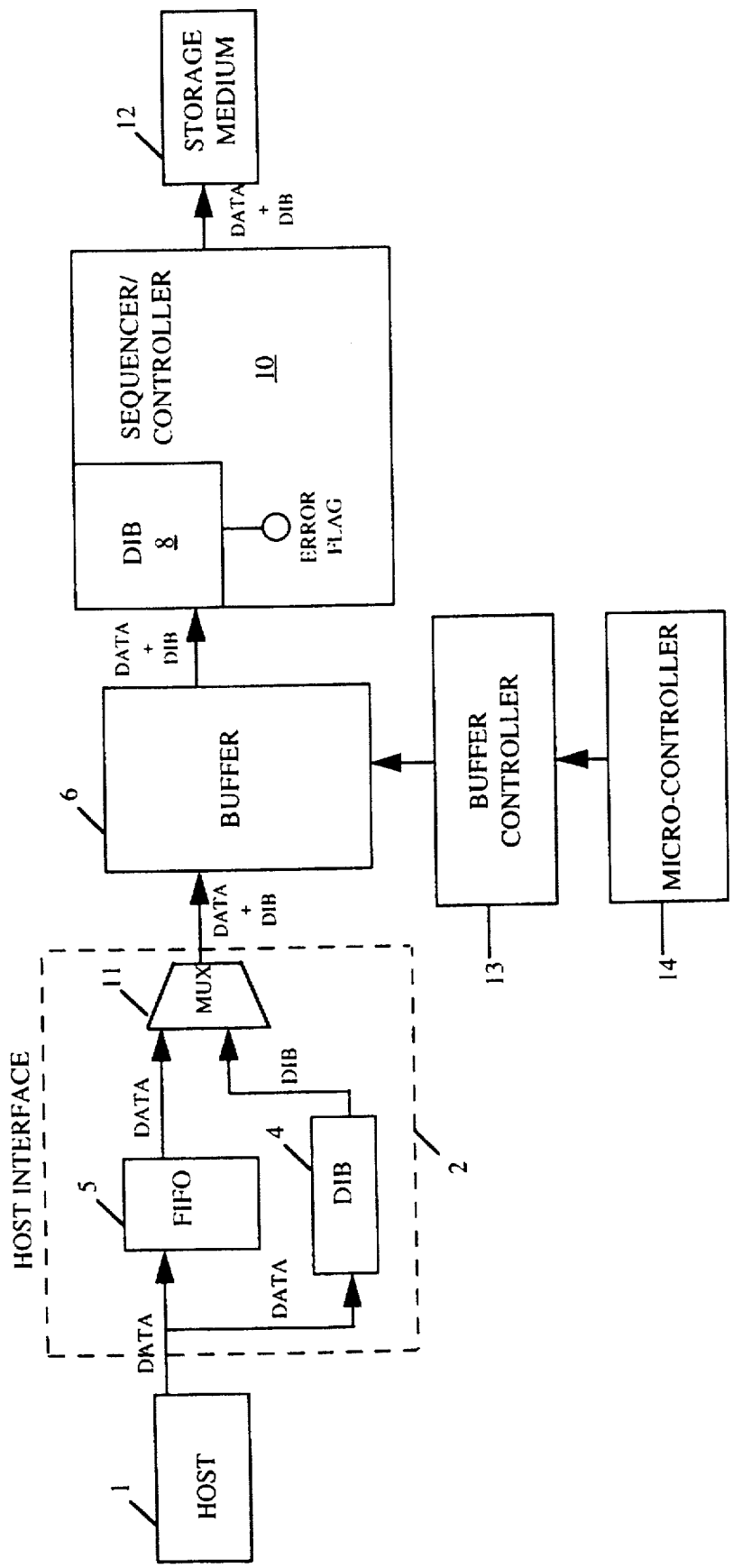
FIG. 1 is a top level block diagram of the write path in a data channel having a host interface that transmits block formatted data through a block memory buffer to a sequencer/controller circuit, illustrating a preferred implementation of the word-wise encoder/detector according to the present invention as a data integrity code to protect data blocks in the buffer.

Referring now to FIG. 1, a preferred word-wise encoder (DIB 4 in FIG. 1) is illustrated as implementing a symbol length data integrity code in the host interface 2, providing redundancy for data blocks stored in a block memory buffer 6.

In a preferred data integrity code implementation of a word-wise encoder, data from a host computing system 1 is passed into host interface (indicated by the dashed box 2) as a series of data words. Once inside the interface 2, the incoming data is provided along two separate paths to a shift register, which is preferably a first-in-first-out ("FIFO") shift register 102, and to DIB 4. Communications between the host 1 and host interface 2, which may be an SCSI or IDE interface for example, are established according to the communications protocol associated with the particular host interface 2. Although the DID encoder circuitry 4 may be formed on a separate chip, it is preferably fabricated in the interface 2 chip as part of a custom ASIC package. The data path into the interface 2 may be switched between an 8 and 16 bit wide path to accommodate either byte or word size formatting of data received from the host 1, and in the word-wise coding implementation disclosed herein, is in the 16 bit data word mode.

As will be discussed in more detail below, the data words within each word formatted data block are sequentially clocked into DIB 4 in synchronization with a word clock signal provided to the interface 2 circuitry. At the same time, the data words of each data block are also sequentially clocked into and out of FIFO 5 and passed through multiplexer 11 to block memory buffer 6 which serves as a temporary storage cache. The buffer 6, which in the present example is a 16×64K memory array, receives the data bytes under the control of a buffer controller 13 and supervisory micro-controller 14.

Figure 2:
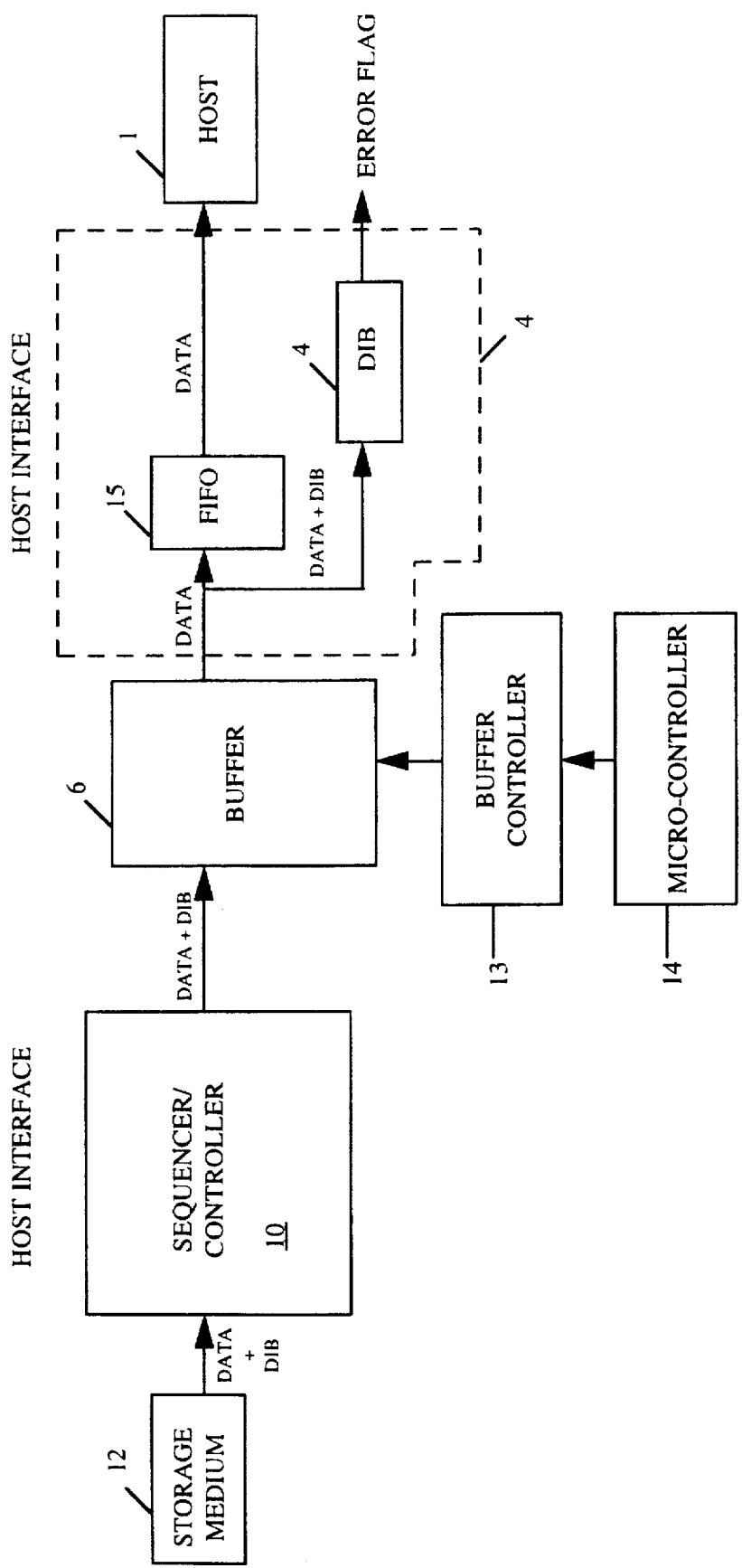
FIG. 2 is a block diagram, similar to FIG. 1 of the read path in a data channel, incorporating the word-wise encoder/detector of the present invention in a data integrity code.

After all the data words in the block of data to be protected by the data integrity code have been clocked through the DIB encoder 4 and the FIFO 5, the DIB encoder 4 preferably clocks out a single redundant word (labeled DIB in FIGS. 1 and 2). During the same clock cycles when the DIB redundancy is output, the multiplexer 11 switches states to allow the DIB redundancy to be passed through the multiplexer 11 and appended to the associated data block stored in the buffer 6. This combination of a data block stored in the buffer 6 together with its appended DIB redundancy is referred to herein as a Reed-Solomon code word.

Turning briefly to the issue of the maximum block length that may be protected by application of a Reed-Solomon based data integrity code, the expression $2^m-1$, defines the "natural block length" of an m bit Reed-Solomon code. The distance properties of Reed-Solomon codes provide that for data blocks having up to $2^m-1$ symbols (including appended redundancy), i.e., the natural block length, the distance between any two code words is equal to r+1 symbols. Thus, for an 8 bit Reed-Solomon code that generates two redundant bytes (r=2), any two non-identical code words are guaranteed to differ by at least three bytes, provided that the code word is less than or equal to the natural block length. Under this scenario, there are certain combinations of three byte errors that are undetectable.

If, on the other hand, the natural block length constraint for the disclosed 8 bit data integrity code is exceeded, there are certain combinations of two byte errors that will be undetectable. All single byte errors, however, remain detectable. This particular property may be taken advantage of in the context of a data integrity code used to protect a DRAM buffer as disclosed herein where the raw bit error rate associated with the DRAM is sufficiently low (typically on the order of $10^{-12}$ or less) to warrant the extension of the code over data blocks that exceed the natural block length. For the present 8 bit coding example, it has been statistically determined that two bytes of Reed-Solomon redundancy may be used to protect up to sector size (i.e., 512 bytes) blocks of data in the DRAM while providing a block undetectable error rate of approximately $10^{-20}$.

Returning now to the discussion of the write path, data is transferred from the buffer 6 in response to signals received from the buffer controller 13 which, together with the supervisor micro-controller 4, regulate the data flow through the buffer 6. Next, the data from the buffer 6 enters a sequencer/controller 10 and is passed through DIB encoder/detector 8 contained therein one codeword at a time. During this stage of the process, the DIB encoder/detector 8 serves as a detector, and if any errors are detected an error flag may be sent from the DIB 8 to the micro-controller 14 to request that the host 1 resend the corrupted data block.

Turning now to FIG. 2, the operation of the data integrity code to protect data transferred over the read path is similar to the operation of the code over the write path, only in the opposite direction. Data blocks read from the storage medium 12 together with its previously appended DIB redundancy (which is preferably written to the storage medium 12 during the writing process) enters the sequencer/controller 10 and is transmitted to the buffer 6 where it is temporarily stored prior to being passed to the host interface 2 under the control of the buffer controller 13.

As described in the referenced patent application Ser. No. 08/497,488 entitled, "Method And Apparatus To Protect Data Within A Disk Drive Buffer," data blocks that enter the sequencer/controller 10 also preferably enter a main ECC encoder circuit (not shown), which is preferably contained within the sequencer/controller 10. The ECC encoder generates a predetermined number of ECC check bytes in response to each data block that passes through the encoder circuit. The newly generated ECC check bytes are then compared to the appended ECC check bytes recovered with the associated data block from the disk. If the regenerated ECC check bytes do not compare to the ECC check bytes recovered from the disk, one or more errors are assumed to be present and error correction routines as disclosed in commonly assigned U.S. Pat. No. 5,241,546 to Peterson et al. may be initiated.

As the data words of the data blocks together with their associated DIB redundancy are transferred from the buffer 6 to the interface circuit 2, the process of regenerating the DIB redundancy and comparing the regenerated result to the redundancy transferred from the data buffer 6 is repeated. The DIB encoder 4 within the interface circuit 2 preferably regenerates the redundancy from the incoming data blocks according to the same coding algorithm used by the DIB circuit 8 in the sequencer/controller 10 (preferably using word-wise processing in response to word clock to implement the same 8 bit symbol code utilized by the DIB 8) and compares the result to the incoming redundancy bytes from the buffer 6. If the DIB values match the transmission is assumed to have been error free. If not, errors are assumed to be present and an error flag from the DIB 4 may be communicated to the micro-controller 14 which may request that the corrupted block be re-read from the storage medium 12.

Although it is within the capabilities of the disclosed Reed-Solomon code to actually correct errors detected during data integrity checking, (according to the known correction properties of Reed-Solomon codes), the relative ease of either requesting the host 1 to resend the information, in the case of write path errors, or re-reading the data in the case of read path errors, makes the institution of correction routines optional. Thus, as noted above, if errors are detected during write mode when data is passed from the host 1 through the host interface 2 and the buffer 6 prior to being transmitted to the write channel for recording on the storage medium 12, a control signal may be sent to the host 1 through the host interface 2 to request that the data be sent again. A similar process may be followed in read mode when data is read back from the storage medium 12 and passed through the buffer 6 and ultimately delivered to the host 1 through the host interface 2. In this case, if errors are detected in the data after it passes through the buffer 6, a status signal may be sent to cause the data to be re-read from the storage medium 12.

It should be noted that in the context of the read path, the operation of the data integrity code block discussed herein is separate from the operation of the main ECC routine used to actually correct errors present in the data recovered from the storage medium 12 itself. However, the actual hardware implementation of the data integrity code block taught herein, e.g., the use of parallel symbol processing in response to a word clock, is applicable to ECC encoder circuits as well as other Reed-Solomon coding applications.

Thus, the foregoing discussion of the use of a data integrity code to protect the buffer 6 is intended to be illustrative of the overall process only, and reference is made to U.S. patent application Ser. No. , entitled "Method And Apparatus To Protect Data Within A Disk Drive Buffer" for a more complete description of the overall system architecture that uses a cross-check code as a data integrity code to protect data stored in a buffer within a data path.

A preferred word-wise processing implementation of a symbol length Reed-Solomon code will now be described. Reed-Solomon codes have generator polynomials (referred to herein as a function of z) of the form:

$$g(z) = \prod_{i=0}^{r-1}(z - \alpha^{J_0+i}) = \sum_{i=0}^{r} g_i z^i \tag{1}$$

where $\alpha$ ("alpha") is a primitive element of a Galois field, GF(q), whose (q−1) powers $\{\alpha^0, \alpha^1, \alpha^2, \ldots \alpha^{q-2}\}$ exhaust the non-zero elements of the field; $J_0$ is an arbitrary logarithm (base alpha) of the first root of the generator polynomial; and where r is the number of redundant symbols generated by the code. Thus, the generator polynomial, g(z), for r=2 (i.e., two redundant symbols) can be written in factored form as follows:

$$g(z)=(z-\alpha^{J_0})(z-\alpha^{J_0+1}) \tag{2}$$

multiplying terms yields:

$$g(z)=z^2-(\alpha^{j_0}+\alpha^{j_0+1})z+\alpha^{2j_0+1} \quad (3)$$

using Equation (1) this expression can be rewritten as:

$$g(z)=g_2z^2+g_1z^1+g_0z^0 \quad (4)$$

where $g_2=1$, $g_1=\alpha^{j_0}+\alpha^{j_0+1}$ and $g_0=\alpha^{2j_0+1}$

Figure 3:
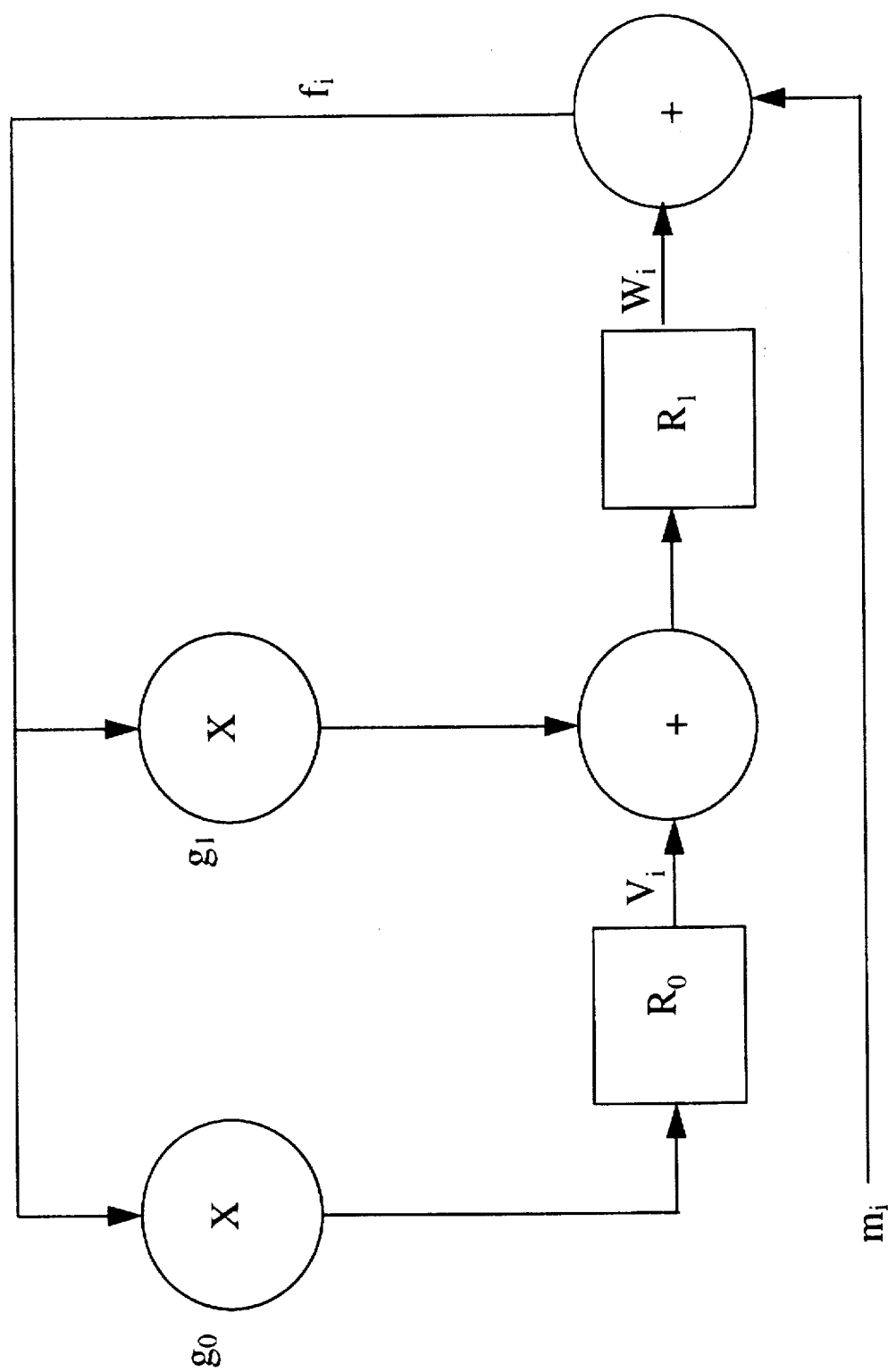
FIG. 3 is a block diagram of a prior art linear feedback shift register encoder/detector that generates two redundant bytes of information (r=2) for each received data block.

A linear r-stage shift register with feedback is illustrated in FIG. 3. The r-stage shift register serves as a conventional encoder circuit for generating two redundant bytes in response to a series of sequentially received data bytes. The fixed multipliers in FIG. 3 use the generator polynomial coefficients $g_0$ and $g_1$. (since $g_2=1$, this multiplier is eliminated); the data symbols comprise the set $\{m_i\}$; and, the contents of the two redundant symbol registers, $R_o$ and $R_1$, at time i are referred to as $v_i$ and $w_i$, respectively. The feedback is referred to as $f_i$. At the beginning of a block of data $R_0$ and $R_1$ are initialized. When the end of a data block is reached in encoding mode, the two redundant symbols generated during the encoding process are transferred from the registers, $R_0$ and $R_1$, and appended to the data block. At the end of the data block in checking mode, the two redundant symbols contained in $R_0$ and $R_1$ are compared (i.e., bitwise XOR'd) to previously appended symbols and, if they match, the block is assumed to be error free. On the other hand, if the symbols generated during the checking mode do not match the originally appended redundant symbols, one or more errors are assumed to have occurred and appropriate corrective action may be taken as described above.

Turning now to the preferred implementation of a Reed-Solomon data integrity code with parallel input processing, the following table for the FIG. 3 sequential r=2 encoder serves as a starting point to illustrate the general methodology involved. Table 1 shows the contents of the registers, $R_0$ and $R_1$, and the feedback line, $f_i$, after the FIG. 3 encoder has processed two consecutive data symbols, i.e., $m_i$ and $m_{i+1}$:

TABLE 1

Status of Signals in FIG. 3 Encoder After Processing Two Consecutive Data Symbols.

| data | feedback | $R_0$ | $R_1$ |
| --- | --- | --- | --- |
| — | — | $v_i$ | $w_i$ |
| $m_i$ | $w_i+m_i$ | $g_0(w_i+m_i)$ | $g_1(w_i+m_i)+v_i$ |
| $m_{i+1}$ | $g_1(w_i+m_i)+v_i+m_{i+1}$ | $g_0g_1(w_i+m_i)+g_0(v_i+m_{i+1})$ | $g_1^2(w_i+m_i)+g_1(v_i+m_{i+1})+g_0(w_i+m_i)$ |

The last row of Table 1 contains the equations that describe the contents of the registers, $R_0$ and $R_1$, and the status of the feedback line, $f_i$, after two data symbols (i.e., one word) has been sequentially processed. From examination of the register contents after two symbol periods, an encoder circuit with parallel inputs is created that has the same register contents and feedback after two symbols of data are processed in one word clock cycle. This is accomplished through the use of parallel symbol inputs and a hardware architecture that has, after one word clock period, identical register and feedback states to those of the FIG. 3 sequential symbol encoder after two symbol clock periods. Significantly, tables similar to Table 1 may be constructed for many different sequential encoder circuits to provide the blueprint for corresponding word-wise processing encoders as taught herein.

In a Reed-Solomon encoder, it is desirable to reduce the number of fixed value multipliers used to generate the redundancy symbols. This is because the combinatorial logic of the multipliers, i.e., $g_0$, $g_1$, $g_2$ ..., tends to dominate the hardware requirements for the encoder. Thus, if certain multipliers can be eliminated, significant hardware savings and overall reduction in processing time can be achieved. For example, in the FIG. 3 sequential processing encoder, the contents of the registers, $R_0$ and $R_1$, after two symbol clock periods, show the need for several fixed value multipliers, i.e., $g_0$, $g_1$, and $g_1^2$, in order to perform two symbol processing in parallel during one word clock period.

In one embodiment of a preferred word-wise encoder/detector, the arbitrary offset value $J_0$ for the powers of alpha is chosen to be 127. As will be shown below, selection of this value for $J_0$ causes $g_0$ to equal 1, advantageously allowing the $g_0$ multiplier to be eliminated. This result can be appreciated from examination of the coefficients of the expanded Reed-Solomon generator polynomial in the context of the Galois field the code operates over. In Reed-Solomon based codes, the roots of the generator polynomial are powers of alpha which in turn are elements of a Galois field. This can be seen from examination of the generator polynomial when written in factored form as in Equation 2 where alpha$^{j_0}$ and alpha$^{j_0+1}$ are roots of the generator polynomial, g(z). Moreover, as is apparent from the expanded generator polynomial (Equation 3 above) the elements of the Galois field also serve as the fixed value multipliers, e.g., $g_0$, $g_1$, ..., used during the encoding process.

In the case of an 8 bit Reed-Solomon symbol code, the code operates over a Galois field having 256 elements referred to as GF(256) or GF($2^8$). A common Galois field representation is a "standard" or "alpha" basis, where the Galois field is defined by a primitive element, alpha, and irreducible polynomial, p(x). P(x) is an irreducible polynomial of degree m, where m is the number of bits in each code symbol. In the 8 bit Reed-Solomon code example, a presently preferred GF(256) has p(x)=$x^8+x^4+x^3+x^2+1$, and its primitive element, $\alpha^1$, equal to x, where x represents the binary field element in polynomial representation over GF(2) as is known in the art. In order to generate a complete GF(256) antilog table, each successive element in the field may be determined by multiplying the preceding field element by the primitive field element, modulo p(x). For example:

$\alpha^1=x=00000010$ (binary)

$\alpha^2=\alpha^1 \cdot \alpha^1 = x^1 \cdot x^1$ mod $P(x)=x^2=00000100$ (binary)

...

$\alpha^5=\alpha^4 \cdot \alpha^1 = x^4 \cdot x^1$ mod $P(x)=x^5=00100000$ (binary)

...

$\alpha^8=\alpha^7 \cdot \alpha^1 = x^7 \cdot x^1$ mod $P(x)=x^8$ mod $(x^8+x^4+x^3+x^2+1)$ $\alpha^8=x^4+x^3+x^2+1=00011101$ (binary)

After the entire GF(256) antilog table is created in this manner (i.e., up to $\alpha^{255}$), generating the log table is simply a matter of reversing the antilog table through appropriate mapping. The complete antilog and log tables for GF(256) with $\alpha^1=x$ and p(x)=$x^8+x^4+x^3+x^2+1$ are given below:

TABLE 2

Antilog Table for GF(256).

| i | $\alpha^i$ HEX |
|---|---|
| 0 | 1 = 01x |
| 1 | 2 = 02x |
| 2 | 4 = 04x |
| 3 | 8 = 08x |
| 4 | 16 = 10x |
| 5 | 32 = 20x |
| 6 | 64 = 40x |
| 7 | 128 = 80x |
| 8 | 29 = 1Dx |
| 9 | 58 = 3Ax |
| 10 | 116 = 74x |
| 11 | 232 = E8x |
| 12 | 205 = CDx |
| 13 | 135 = 87x |
| 14 | 19 = 13x |
| 15 | 38 = 26x |
| 16 | 76 = 4Cx |
| 17 | 152 = 98x |
| 18 | 45 = 2Dx |
| 19 | 90 = 5Ax |
| 20 | 180 = B4x |
| 21 | 117 = 75x |
| 22 | 234 = EAx |
| 23 | 201 = C9x |
| 24 | 143 = 8Fx |
| 25 | 3 = 03x |
| 26 | 6 = 06x |
| 27 | 12 = 0Cx |
| 28 | 24 = 18x |
| 29 | 48 = 30x |
| 30 | 96 = 60x |
| 31 | 192 = C0x |
| 32 | 157 = 9Dx |
| 33 | 39 = 27x |
| 34 | 78 = 4Ex |
| 35 | 156 = 9Cx |
| 36 | 37 = 25x |
| 37 | 74 = 4Ax |
| 38 | 148 = 94x |
| 39 | 53 = 35x |
| 40 | 106 = 6Ax |
| 41 | 212 = D4x |
| 42 | 181 = B5x |
| 43 | 119 = 77x |
| 44 | 238 = EEx |
| 45 | 193 = C1x |
| 46 | 159 = 9Fx |
| 47 | 35 = 23x |
| 48 | 70 = 46x |
| 49 | 140 = 8Cx |
| 50 | 5 = 05x |
| 51 | 10 = 0Ax |
| 52 | 20 = 14x |
| 53 | 40 = 28x |
| 54 | 80 = 50x |
| 55 | 160 = A0x |
| 56 | 93 = 5Dx |
| 57 | 186 = BAx |
| 58 | 105 = 69x |
| 59 | 210 = D2x |
| 60 | 185 = B9x |
| 61 | 111 = 6Fx |
| 62 | 222 = DEx |
| 63 | 161 = A1x |
| 64 | 95 = 5Fx |
| 65 | 190 = BEx |
| 66 | 97 = 61x |
| 67 | 194 = C2x |
| 68 | 153 = 99x |
| 70 | 94 = 5Ex |
| 71 | 188 = BCx |
| 72 | 101 = 65x |
| 73 | 202 = CAx |
| 74 | 137 = 89x |
| 75 | 15 = 0Fx |

TABLE 2-continued

Antilog Table for GF(256).

| i | $\alpha^i$ HEX |
|---|---|
| 76 | 30 = 1Ex |
| 77 | 60 = 3Cx |
| 78 | 120 = 78x |
| 79 | 240 = F0x |
| 80 | 253 = FDx |
| 81 | 231 = E7x |
| 82 | 211 = D3x |
| 83 | 187 = BBx |
| 84 | 107 = 6Bx |
| 85 | 214 = D6x |
| 86 | 177 = B1x |
| 87 | 127 = 7Fx |
| 88 | 254 = FEx |
| 89 | 225 = E1x |
| 90 | 223 = DFx |
| 91 | 163 = A3x |
| 92 | 91 = 5Bx |
| 93 | 182 = B6x |
| 94 | 113 = 71x |
| 95 | 226 = E2x |
| 96 | 217 = D9x |
| 97 | 175 = AFx |
| 98 | 67 = 43x |
| 99 | 134 = 86x |
| 100 | 17 = 11x |
| 101 | 34 = 22x |
| 102 | 68 = 44x |
| 103 | 136 = 88x |
| 104 | 13 = 0Dx |
| 105 | 26 = 1Ax |
| 106 | 52 = 34x |
| 107 | 104 = 68x |
| 108 | 208 = D0x |
| 109 | 189 = BDx |
| 110 | 103 = 67x |
| 111 | 206 = CEx |
| 112 | 129 = 81x |
| 113 | 31 = 1Fx |
| 114 | 62 = 3Ex |
| 115 | 124 = 7Cx |
| 116 | 248 = F8x |
| 117 | 237 = EDx |
| 118 | 199 = C7x |
| 119 | 147 = 93x |
| 120 | 59 = 3Bx |
| 121 | 118 = 76x |
| 122 | 236 = ECx |
| 123 | 197 = C5x |
| 124 | 151 = 97x |
| 125 | 51 = 33x |
| 126 | 102 = 66x |
| 127 | 204 = CCx |
| 128 | 133 = 85x |
| 129 | 23 = 17x |
| 130 | 46 = 2Ex |
| 131 | 92 = 5Cx |
| 132 | 184 = B8x |
| 133 | 109 = 6Dx |
| 134 | 218 = DAx |
| 135 | 169 = A9x |
| 136 | 79 = 4Fx |
| 137 | 158 = 9Ex |
| 138 | 33 = 21x |
| 139 | 66 = 42x |
| 140 | 132 = 84x |
| 141 | 21 = 15x |
| 142 | 42 = 2Ax |
| 143 | 84 = 54x |
| 144 | 168 = A8x |
| 145 | 77 = 4Dx |
| 146 | 154 = 9Ax |
| 147 | 41 = 29x |
| 148 | 82 = 52x |
| 149 | 164 = A4x |
| 150 | 85 = 55x |

TABLE 2-continued

Antilog Table for GF(256).

| i | $\alpha^i$ HEX |
|---|---|
| 151 | 170 = AAx |
| 152 | 73 = 49x |
| 153 | 146 = 92x |
| 154 | 57 = 39x |
| 155 | 114 = 72x |
| 156 | 228 = E4x |
| 157 | 213 = D5x |
| 158 | 183 = B7x |
| 159 | 115 = 73x |
| 160 | 230 = E6x |
| 161 | 209 = D1x |
| 162 | 191 = BFx |
| 163 | 99 = 63x |
| 164 | 198 = C6x |
| 165 | 145 = 91x |
| 166 | 63 = 3Fx |
| 167 | 126 = 7Ex |
| 168 | 252 = FCx |
| 169 | 229 = E5x |
| 170 | 215 = D7x |
| 171 | 179 = B3x |
| 172 | 123 = 7Bx |
| 173 | 246 = F6x |
| 174 | 241 = F1x |
| 175 | 255 = FFx |
| 176 | 227 = E3x |
| 177 | 219 = DBx |
| 178 | 171 = ABx |
| 179 | 75 = 4Bx |
| 180 | 150 = 96x |
| 181 | 49 = 31x |
| 182 | 98 = 62x |
| 183 | 196 = C4x |
| 184 | 149 = 95x |
| 185 | 55 = 37x |
| 186 | 110 = 6Ex |
| 187 | 220 = DCx |
| 188 | 165 = A5x |
| 189 | 87 = 57x |
| 190 | 174 = AEx |
| 191 | 65 = 41x |
| 192 | 130 = 82x |
| 193 | 25 = 19x |
| 194 | 50 = 32x |
| 195 | 100 = 64x |
| 196 | 200 = C8x |
| 197 | 141 = 8Dx |
| 198 | 7 = 07x |
| 199 | 14 = 0Ex |
| 200 | 28 = 1Cx |
| 201 | 56 = 38x |
| 202 | 112 = 70x |
| 203 | 224 = E0x |
| 204 | 221 = DDx |
| 205 | 167 = A7x |
| 206 | 83 = 53x |
| 207 | 166 = A6x |
| 208 | 81 = 51x |
| 209 | 162 = A2x |
| 210 | 89 = 59x |
| 211 | 178 = B2x |
| 212 | 121 = 79x |
| 213 | 242 = F2x |
| 214 | 249 = F9x |
| 215 | 239 = EFx |
| 216 | 195 = C3x |
| 217 | 155 = 9Bx |
| 218 | 43 = 2Bx |
| 219 | 86 = 56x |
| 220 | 172 = ACx |
| 221 | 69 = 45x |
| 222 | 138 = 8Ax |
| 223 | 9 = 09x |
| 224 | 18 = 12x |
| 225 | 36 = 24x |

TABLE 2-continued

Antilog Table for GF(256).

| i | $\alpha^i$ HEX |
|---|---|
| 226 | 72 = 48x |
| 227 | 144 = 90x |
| 228 | 61 = 3Dx |
| 229 | 122 = 7Ax |
| 230 | 244 = F4x |
| 231 | 245 = F5x |
| 232 | 247 = F7x |
| 233 | 243 = F3x |
| 234 | 251 = FBx |
| 235 | 235 = EBx |
| 236 | 203 = CBx |
| 237 | 139 = 8Bx |
| 238 | 11 = 0Bx |
| 239 | 22 = 16x |
| 240 | 44 = 2Cx |
| 241 | 88 = 58x |
| 242 | 176 = B0x |
| 243 | 125 = 7Dx |
| 244 | 250 = FAx |
| 245 | 233 = E9x |
| 246 | 207 = CFx |
| 247 | 131 = 83x |
| 248 | 27 = 1Bx |
| 249 | 54 = 36x |
| 250 | 108 = 6Cx |
| 251 | 216 = D8x |
| 252 | 173 = ADx |
| 253 | 71 = 47x |
| 254 | 142 = 8Ex |
| 255 | 1 = 01x |

TABLE 3

Log Table for GF(256); $\alpha^1 = x$;
$p(x)=x^8 + x^4 + x^3 + x^2 + 1$

| i | LOG [i] Hex |
|---|---|
| 1 | 255 = FFx |
| 2 | 1 = 01x |
| 3 | 25 = 19x |
| 4 | 2 = 02x |
| 5 | 50 = 32x |
| 6 | 26 = 1Ax |
| 7 | 198 = C6x |
| 8 | 3 = 03x |
| 9 | 223 = DFx |
| 10 | 51 = 33x |
| 11 | 238 = EEx |
| 12 | 27 = 1Bx |
| 13 | 104 = 68x |
| 14 | 199 = C7x |
| 15 | 75 = 4Bx |
| 16 | 4 = 04x |
| 17 | 100 = 64x |
| 18 | 324 = E0x |
| 19 | 14 = 0Ex |
| 20 | 52 = 34x |
| 21 | 141 = 8Dx |
| 22 | 239 = EFx |
| 23 | 129 = 81x |
| 24 | 28 = 1Cx |
| 25 | 193 = C1x |
| 26 | 105 = 69x |
| 27 | 248 = F8x |
| 28 | 200 = C8x |
| 29 | 8 = 08x |
| 30 | 76 = 4Cx |
| 31 | 113 = 71x |
| 32 | 5 = 05x |
| 33 | 138 = 8Ax |
| 34 | 101 = 65x |

TABLE 3-continued

Log Table for GF(256); $\alpha^1 = x$;
$p(x)=x^8 + x^4 + x^3 + x^2 + 1$

| i | LOG [i] Hex |
|---|---|
| 35 | 47 = 2Fx |
| 36 | 225 = E1x |
| 37 | 36 = 24x |
| 38 | 15 = 0Fx |
| 39 | 33 = 21x |
| 40 | 53 = 35x |
| 41 | 147 = 93x |
| 42 | 142 = 8Ex |
| 43 | 218 = DAx |
| 44 | 240 = F0x |
| 45 | 18 = 12x |
| 46 | 130 = 82x |
| 47 | 69 = 45x |
| 48 | 29 = 1Dx |
| 49 | 181 = B5x |
| 50 | 194 = C2x |
| 51 | 125 = 7Dx |
| 52 | 106 = 6Ax |
| 53 | 39 = 27x |
| 54 | 249 = F9x |
| 55 | 185 = B9x |
| 56 | 201 = C9x |
| 57 | 154 = 9Ax |
| 58 | 9 = 09x |
| 59 | 120 = 78x |
| 60 | 77 = 4Dx |
| 61 | 228 = E4x |
| 62 | 114 = 72x |
| 63 | 166 = A6x |
| 64 | 6 = 06x |
| 65 | 191 = BFx |
| 66 | 139 = 8Bx |
| 67 | 98 = 62x |
| 68 | 102 = 66x |
| 69 | 221 = DDx |
| 70 | 48 = 30x |
| 71 | 253 = FDx |
| 72 | 226 = E2x |
| 73 | 152 = 98x |
| 74 | 37 = 25x |
| 75 | 179 = B3x |
| 76 | 16 = 10x |
| 77 | 145 = 91x |
| 78 | 34 = 22x |
| 79 | 136 = 88x |
| 80 | 54 = 36x |
| 81 | 208 = D0x |
| 82 | 148 = 94x |
| 83 | 206 = CEx |
| 84 | 143 = 8Fx |
| 85 | 150 = 96x |
| 86 | 219 = DBx |
| 87 | 189 = BDx |
| 88 | 241 = F1x |
| 89 | 210 = D2x |
| 90 | 19 = 13x |
| 91 | 92 = 5Cx |
| 92 | 131 = 83x |
| 93 | 56 = 38x |
| 94 | 70 = 46x |
| 95 | 64 = 40x |
| 96 | 30 = 1Ex |
| 97 | 66 = 42x |
| 98 | 182 = B6x |
| 99 | 163 = A3x |
| 100 | 195 = C3x |
| 104 | 72 = 48x |
| 102 | 126 = 7Ex |
| 103 | 110 = 6Ex |
| 104 | 107 = 6Bx |
| 105 | 58 = 3Ax |
| 106 | 40 = 28A |
| 107 | 84 = 54x |
| 108 | 250 = FAx |
| 109 | 133 = 85x |
| 110 | 186 = BAx |
| 111 | 61 = 3Dx |
| 112 | 202 = CAx |
| 113 | 94 = 5Ex |
| 114 | 155 = 9Bx |
| 115 | 159 = 9Fx |
| 116 | 10 = 0Ax |
| 117 | 21 = 15x |
| 118 | 121 = 79x |
| 119 | 43 = 2Bx |
| 120 | 78 = 4Ex |
| 121 | 212 = D4x |
| 122 | 229 = E5x |
| 123 | 172 = ACx |
| 124 | 115 = 73x |
| 125 | 243 = F3x |
| 126 | 167 = A7x |
| 127 | 87 = 57x |
| 128 | 7 = 07x |
| 129 | 112 = 70x |
| 130 | 192 = C0x |
| 131 | 247 = F7x |
| 132 | 140 = 8Cx |
| 133 | 128 = 80x |
| 134 | 99 = 63x |
| 135 | 13 = 0Dx |
| 136 | 103 = 67x |
| 137 | 74 = 4Ax |
| 138 | 222 = DEx |
| 139 | 237 = EDx |
| 140 | 49 = 31x |
| 141 | 197 = C5x |
| 142 | 254 = FEx |
| 143 | 24 = 18x |
| 144 | 227 = E3x |
| 145 | 165 = A5x |
| 146 | 153 = 99x |
| 147 | 119 = 77x |
| 148 | 38 = 26x |
| 149 | 184 = B8x |
| 150 | 180 = B4x |
| 151 | 124 = 7Cx |
| 152 | 17 = 11x |
| 153 | 68 = 44x |
| 154 | 146 = 92x |
| 155 | 217 = D9x |
| 156 | 35 = 23x |
| 157 | 32 = 20x |
| 158 | 137 = 89x |
| 159 | 46 = 2Ex |
| 160 | 55 = 37x |
| 161 | 63 = 3Fx |
| 162 | 209 = D1x |
| 163 | 91 = 5Bx |
| 164 | 149 = 95x |
| 165 | 188 = BCx |
| 166 | 207 = CFx |
| 167 | 205 = CDx |
| 168 | 144 = 90x |
| 169 | 135 = 87x |
| 170 | 151 = 97x |
| 171 | 178 = B2x |
| 172 | 220 = DCx |
| 173 | 252 = FCx |
| 174 | 190 = BEx |
| 175 | 97 = 61x |
| 176 | 242 = F2x |
| 177 | 86 = 56x |
| 178 | 211 = D3x |
| 179 | 171 = ABx |
| 180 | 20 = 14x |
| 181 | 42 = 2Ax |
| 182 | 93 = 5Dx |

TABLE 3-continued

Log Table for GF(256); $\alpha^1 = x$;
$p(x)=x^8 + x^4 + x^3 + x^2 + 1$

| i | LOG [i] Hex |
|---|---|
| 183 | 158 = 9Ex |
| 184 | 132 = 84x |
| 185 | 60 = 3Cx |
| 186 | 57 = 39x |
| 187 | 83 = 53x |
| 188 | 71 = 47x |
| 189 | 109 = 6Dx |
| 190 | 65 = 41x |
| 191 | 162 = A2x |
| 192 | 31 = 1Fx |
| 193 | 45 = 2Dx |
| 194 | 67 = 43x |
| 195 | 216 = D8x |
| 196 | 183 = B7x |
| 197 | 123 = 7Bx |
| 198 | 164 = A4x |
| 199 | 118 = 76x |
| 200 | 196 = C4x |
| 201 | 23 = 17x |
| 202 | 73 = 49x |
| 203 | 236 = ECx |
| 204 | 127 = 7Fx |
| 205 | 12 = 0Cx |
| 206 | 111 = 6Fx |
| 207 | 246 = F6x |
| 208 | 108 = 6Cx |
| 209 | 161 = A1x |
| 210 | 59 = 3Bx |
| 211 | 82 = 52x |
| 212 | 41 = 29x |
| 213 | 157 = 9Dx |
| 214 | 85 = 55x |
| 215 | 170 = AAx |
| 216 | 251 = FBx |
| 217 | 96 = 60x |
| 218 | 134 = 86x |
| 219 | 177 = B1x |
| 220 | 187 = BBx |
| 221 | 204 = CCx |
| 222 | 62 = 3Ex |
| 223 | 90 = 5Ax |
| 224 | 203 = CBx |
| 225 | 89 = 59x |
| 226 | 95 = 5Fx |
| 227 | 176 = B0x |
| 228 | 156 = 9Cx |
| 229 | 169 = A9x |
| 230 | 160 = A0x |
| 231 | 81 = 51x |
| 232 | 11 = 0Bx |
| 233 | 245 = F5x |
| 234 | 22 = 16x |
| 235 | 235 = EBx |
| 236 | 122 = 7Ax |
| 237 | 117 = 75x |
| 238 | 44 = 2Cx |
| 239 | 215 = D7x |
| 240 | 79 = 4Fx |
| 241 | 174 = AEx |
| 242 | 213 = D5x |
| 243 | 233 = E9x |
| 244 | 230 = E6x |
| 245 | 231 = E7x |
| 246 | 173 = ADx |
| 247 | 232 = E8x |
| 248 | 116 = 74x |
| 249 | 214 = D6x |
| 250 | 244 = F4x |
| 251 | 234 = EAx |
| 252 | 168 = A8x |
| 253 | 80 = 50x |
| 254 | 88 = 58x |
| 255 | 175 = AFx |

While the disclosure of the antilog and log tables is primarily to facilitate understanding of the methodology involved in arriving at the reduced hardware implementation of the disclosed encoder architecture, it should also be noted that the antilog or log tables may be used to implement the Galois field operations to e.g., carry out the fixed value multiplications in the encoder circuit. In this case, the antilog and log tables may be stored as look-up tables in memory made available to the encoder circuitry. Alternatively, a Galois field arithmetic logic unit ("ALU") may be utilized to carry out the necessary Galois field operations.

Returning now to simplification of the hardware requirements for the word-wise encoder implementation (i.e., processing two symbols in parallel in accordance with a word clock), it will be recalled that for r=2, the generator polynomial, g(z) is of the form:

$$g(z)=z^2-(\alpha^{J_0}+\alpha^{J_0+1})z+\alpha^{2J_0+1}$$

substituting $J_0=127$ into this equation yields:

$$g(z)=z^2-(\alpha^{127}+\alpha^{128})z+\alpha^{255} \quad (5)$$

Referring to the antilog table (Table 2) it can be seen that the $g_0$ multiplier, i.e. $\alpha^{255}$, is equal to 1, thus confirming that this multiplier can be eliminated. In order to add the two powers of alpha in $g_1$ ($\alpha^{127}$ and $\alpha^{128}$), it is first necessary to look up the antilog (base alpha) of these numbers in Table 2 above; bitwise XOR the antilogs together; and then take the log base alpha (from Table 3) of this interim result to obtain a single power of alpha as the result. From Table 2 it can be seen that $\alpha^{127}$ equals 204 and $\alpha^{128}$ equals 133. The bit-wise addition of 204 and 133 modulo 2 equals 73. This result is then converted back to a power of alpha using Table 3, and the log base alpha of 73 equals $\alpha^{152}$.

Thus, equation (5) can be simplified as follows:

$$g(z)=z^2-\alpha^{152}z+1 \quad (6)$$

The fixed value multipliers for this code are: $g_0=1$, $g_1=\alpha^{152}=73$, and $g_2=1$. Since both $g_0$ and $g_2$ are equal to 1 they can be eliminated, with only the single $g_1$ multiplier remaining.

Figure 4:
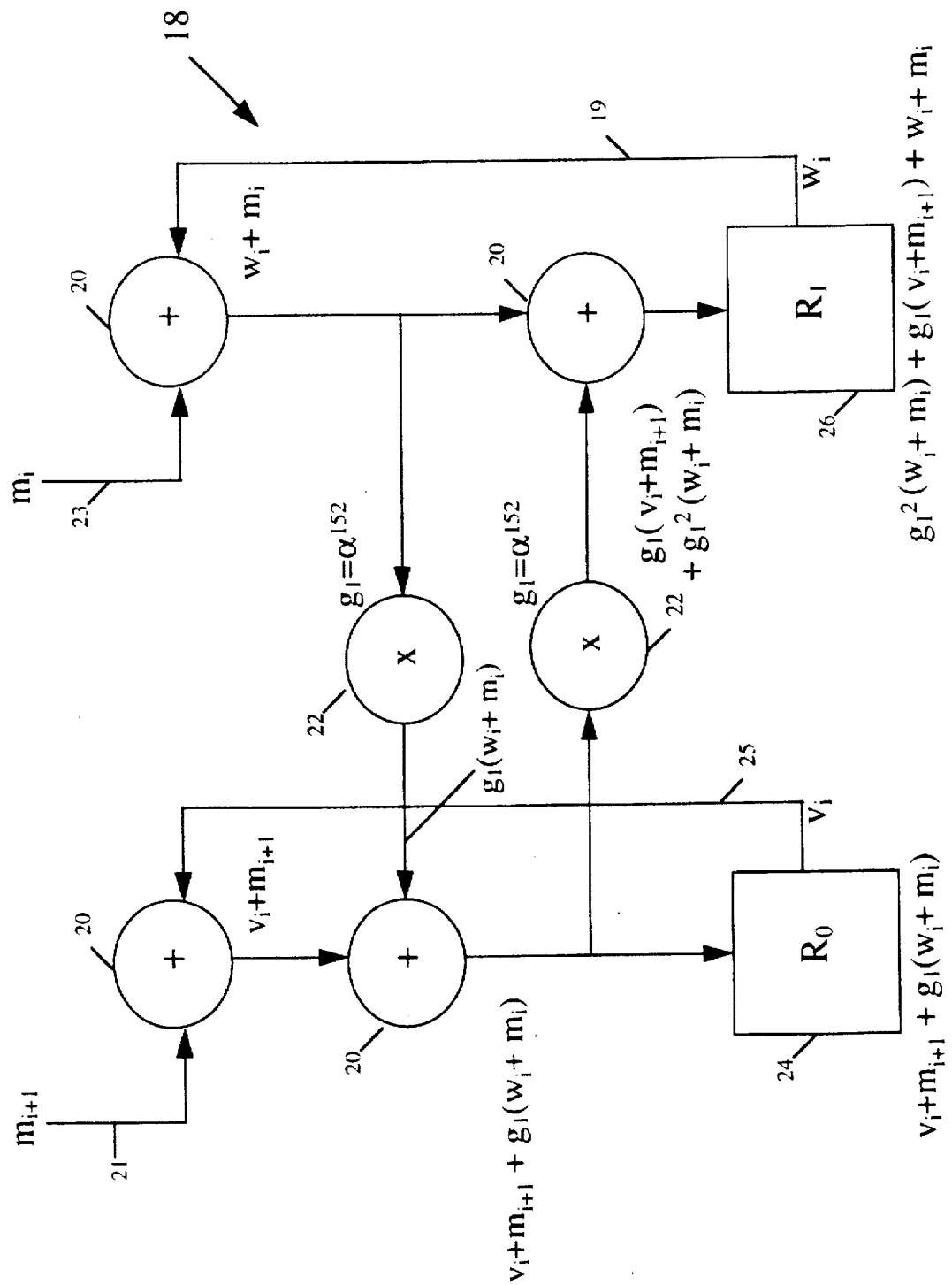
FIG. 4 is a block diagram of an encoder/detector according to the present invention for generating two redundant bytes to protect a received data block, and having a fixed multiplier, $g_0$, equal to one.

FIG. 4 illustrates a parallel input word-wise encoder 18 with reduced hardware complexity that implements an 8 bit Reed-Solomon symbol code with r=2. The encoder 18 includes two fixed value $g_1$ multipliers 22, with $g_1$ equal to $\alpha^{152}$, four GF(256) adders 20, and two storage registers, 24 and 26, which are labeled as $R_0$ and $R_1$, respectively. The encoder 18 has two parallel inputs 21 and 23 that receive data bytes $m_{i+1}$ and $m_i$, respectively. The combination of terms resulting from the feedback of the initial contents of the registers $R_0$ and $R_1$ ($v_i$ and $w_i$, respectively) on lines 25 and 19 with the incoming data bytes ($m_{i+1}$ and $m_i$, respectively) during one word clock cycle are illustrated at the output of the various adders 20 and multipliers 22 in the encoder 18. Comparison of the Table 1 register contents, $R_0$ and $R_1$, with $g_0$ set equal to zero, and the contents of registers $R_0$ and $R_1$ 24 and 26 in FIG. 4, shows that the register contents are same in the FIG. 4 implementation after one word clock signal as in the FIG. 3 sequential encoder after two data bytes have been processed. This confirms that the FIG. 4 parallel input encoder 18 is a true alternative to the FIG. 3 sequential encoder. As can be seen, the longest propagation path in the FIG. 4 encoder 18 traverses two $g_1$ multipliers 22 and three adders 20.

Figure 5:
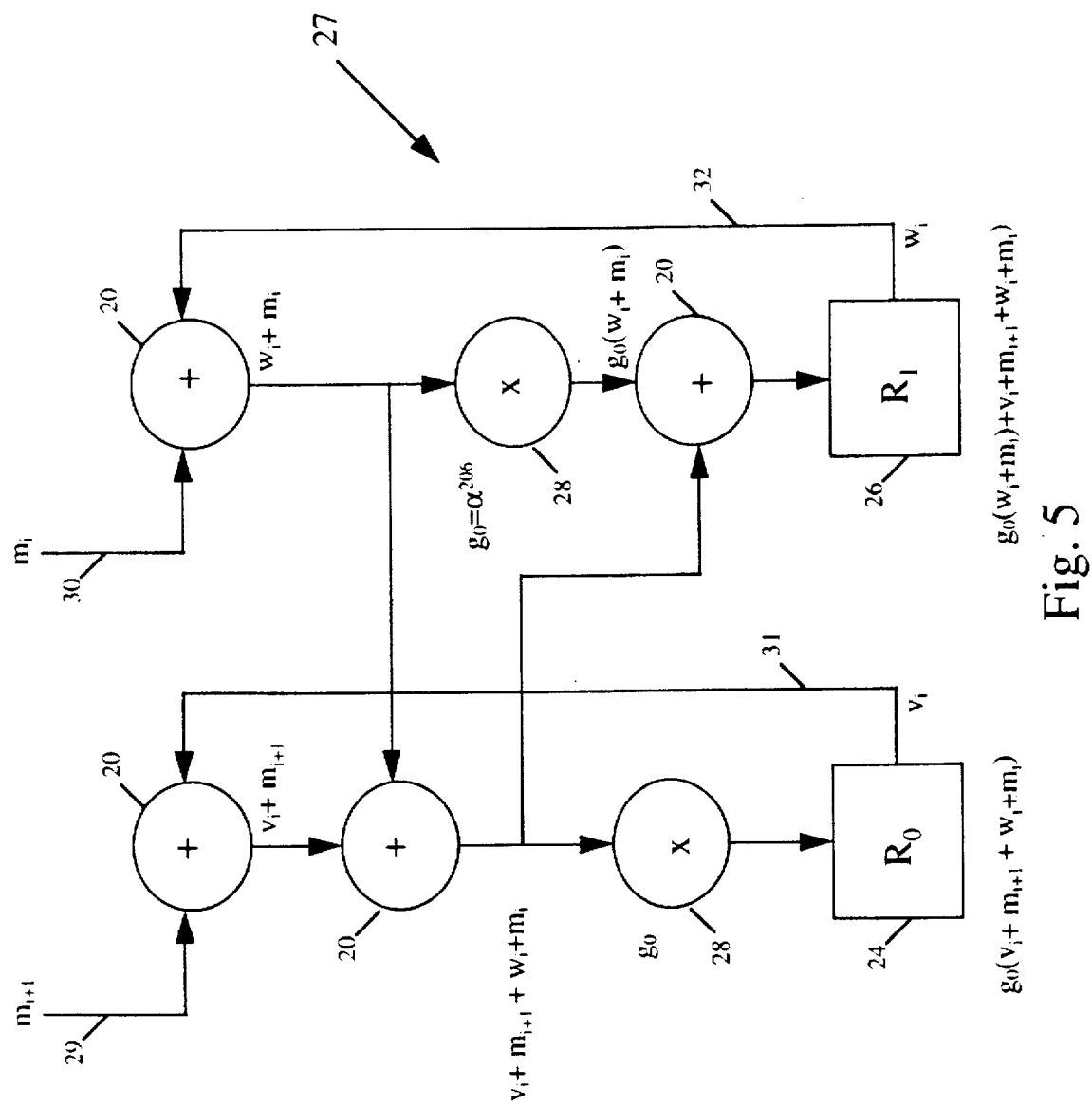
FIG. 5 is a block diagram of a presently preferred embodiment of an encoder/detector according to the present invention that generates two redundant bytes of information, and has a fixed multiplier, $g_1$, equal to one.

Another, and presently preferred embodiment of a Reed-Solomon encoder 27 is illustrated in FIG. 5. In this embodiment, the arbitrary offset value, $J_0$, has been set equal to 230, resulting in the elimination of the $g_1$ fixed multiplier. As will be shown, this code enables a desirably smaller and faster implementation of the encoder 27 to be created.

Following the same methodology as described with reference to the FIG. 4 encoder 18, the expanded generator polynomial with r=2 and $J_0$=230 is given below:

$$g(z)=z^2-(\alpha^{230}+\alpha^{231})z+\alpha^{461} \quad (7)$$

As before, $\alpha^{230}$ and $\alpha^{231}$ are first added together using the antilog and log tables disclosed above. Reference to the antilog table shows that $\alpha^{230}$ is equal to 244 and $\alpha^{231}$ equals 245. Adding these two numbers bit-wise modulo 2, and taking the log of the result (from Table 3) yields $\alpha^{255}$ which in turn equals 1. Since $\alpha^{255}$=1, the $g_0$ multiplier $\alpha^{461}$= $\alpha^{255}*\alpha^{206}$=1*$\alpha^{206}$=$\alpha^{206}$. Thus, equation (7) can be rewritten as:

$$g(z)=z^2-z+\alpha^{206} \quad (8)$$

For this 8 bit symbol code with $J_0$ equal to 230, and r=2, the multipliers are valued as follows: $g_0$=$\alpha^{206}$=83 (from the antilog table, Table 2), $g_1$=1, and $g_2$=1. Since both $g_1$ and $g_2$ are equal to 1 they can be eliminated, and only the $g_0$ multiplier 28 remains.

The FIG. 5 hardware implementation of this code utilizes a parallel input word-wise processing architecture, and includes two parallel inputs 29 and 30, for receiving data bytes $m_{i+1}$ and $m_i$ respectively; four GF(256) adders 20; two fixed $g_0$ multipliers 28; and two registers 24 and 26. In this embodiment, however, the $g_1$ multiplier has been eliminated leaving only the $g_0$ multiplier 28 in the encoder circuit 27. The adders 20 and $g_0$ multipliers 28 are connected as shown in FIG. 5. The feedback line 31 from register $R_0$ 24 is connected to the adder 20 receiving data byte $m_{i+1}$, and the feedback line 32 from $R_1$ 26 is connected to adder 20 which receives the $m_i$ input. It can be confirmed that the FIG. 5 encoder 27 is a word-wise equivalent of the FIG. 3 sequential encoder by setting $g_1$ equal to one in Table 1, and comparing the Table 1 register contents to the register contents shown in FIG. 5. As can be seen, once $g_1$ is removed from the Table 1 equations, the register contents of the two encoders are identical, demonstrating that the FIG. 5 encoder may be used to implement an 8 bit symbol code when only a 16 bit clock is available.

The FIG. 5 encoder 27 has a particularly compact design, demonstrating substantial savings in propagation path length over the FIG. 4 embodiment. In FIG. 5, the longest propagation path traverses only one multiplier 28 and two adders 20. Comparison of the FIG. 5 implementation with that of FIG. 4 reveals that the multiplier 28 in FIG. 5 is slightly smaller when both multipliers 22 in FIG. 4 incur three exclusive or ("XOR") delays. For example, the total cycle time for FIG. 4 is:

$$R_p+9X+R_s+C_s \quad$$

where $R_p$ is the register propagation time, $R_s$ is the register setup time, $C_s$ is clock skew allowance, an X is an XOR delay. By way of comparison, the total cycle time for FIG. 5 is:

$$R_p+4X+R_s+C_s \quad$$

The reduction of five XOR delays is approximately equal to a 5 nano second improvement in propagation delays with current technologies. Thus, the encoder implementation of FIG. 5 is desirably smaller and faster.

From the foregoing it can be seen that a Reed-Solomon data integrity code implemented through a word-wise parallel input encoder/detector with reduced hardware complexity and minimized symbol propagation path length has been provided. It should be appreciated that many variations on the generalized methodology disclosed herein are possible. For example, the teachings herein could be used to construct a word-wise Reed-Solomon ECC encoder that processes two data symbols in parallel over one word clock cycle. Further, many variations on the code utilized both in terms of the length of the symbol code, such as 10 or 16 bit symbol codes, for example, and the number of redundant symbols generated are possible.

Having thus described an embodiment of the invention, it will now be appreciated that the objects of the invention have been fully achieved, and it will be understood by those skilled in the art that many changes in construction and widely differing embodiments and applications of the invention will suggest themselves without departing from the spirit and scope of the invention.

For example, while the particular embodiments of a Reed-Solomon encoder disclosed herein illustrate a parallel input Reed-Solomon encoder that receives 16 bit data words in response to a word clock signal and encodes the received data blocks according to an 8 bit Reed-Solomon code, many more codes and parallel input encoder circuits may be designed based on the teachings herein. Thus, a generalized methodology for implementing a symbol oriented code in an encoder receiving data words in response to a word clock has been disclosed.

Accordingly, the disclosure and the description herein are purely illustrative and are not intended to be in any sense limiting.

What is claimed is:

1. A method of encoding blocks of data to generate redundancy information according to an 8 bit symbol length code, the 8 bit symbol length code being a Reed-Solomon code characterized by a generator polynomial $g(x)=z^2-z+\alpha^{206}$, operating over a Galois field having 256 elements, said Galois field being defined by a Galois field generator polynomial $p(x)=x^8+x^4+x^3+x^2+1$ and a Primitive alpha element equal to 02x (hexadecimal), the method comprising the steps of:

(a) receiving data blocks comprising a multiplicity of 16 bit data words into an encoder;

(b) providing first and second parallel input paths, said first and second paths receiving respective first and second symbols of a received data word during a single word clock period;

(c) passing said first and said second symbols through corresponding first and second parallel circuit paths of said encoder during a single word clock period; and (d) generating redundancy information from said encoder representative of said data blocks in accordance with the symbol length code after said series of data words has been passed through said encoder.

2. The method of claim 1 wherein said symbol length code is a data integrity code that protects data blocks stored in a block buffer memory in a data channel.

3. The method of claim 2 wherein said data channel is in a disk drive storage device.

4. The method of claim 3 wherein the block of data comprises 512 bytes.

5. A method of encoding block formatted data received by an encoder as a series of 16 bit data words according to an 8 bit symbol length Reed-Solomon code characterized by a generator polynomial $g(x)=z^2-z+\alpha^{206}$, operating over a Galois field having 256 elements, said Galois field defined by a Galois field generator polynomial $p(x)=x^8+x^4+x^3+x^2+1$ and a primitive alpha element equal to 02x (hexadecimal), the method comprising the steps of:

(a) transmitting data words of a data block to an input of an encoder circuit;

(b) providing a clocking signal to said encoder such that said encoder circuitry operates at one-half the rate associated with a symbol rate of the symbol length code;

(c) splitting said transmitted data words into first and second data symbols;

(d) transmitting said first and second data symbols over first and second parallel paths within said encoder circuit, each of said first and second paths providing a data path to a storage register, each storage register updated with a new storage value directly from the corresponding data path during each word clock period; and (e) outputting generated redundancy information from said storage registers after said series of data words has been passed trough said encoder, said generated redundancy formed in accordance with the symbol length code.

6. The method of claim 5 wherein said symbol length code is a data integrity code that protects data blocks stored in a block buffer memory in a data channel.

7. The method of claim 6 wherein said data channel is in a disk drive storage device.

8. The method of claim 7 wherein said data block comprises 512 bytes.

9. An word-wise encoder comprising:

a first input and a second input, said first input receiving a first data byte and said second input receiving a second data byte wherein said first and second data bytes together comprise respective halves of a single data word;

a first summing circuit connected to said first input, said first summing circuit adding said first data byte to a first feedback byte to produce a first summing circuit output;

a second summing circuit connected to said second input, said second summing circuit adding said second data byte to a second feedback byte to produce a second summing circuit output;

a third summing circuit connected to said first summing circuit output and to said second summing circuit output, said third summing circuit adding said first summing circuit output and said second summing circuit output together to produce a third summing circuit output;

a first multiplier connected to said third summing circuit output for multiplying said third summing circuit output by a fixed value to arrive at a first product output;

a first storage register connected to said first product output;

a second multiplier connected to said second summing circuit output for multiplying said second summing circuit output by said fixed value to arrive at a second product output;

a fourth summing circuit connected to said second product output and to said third summing circuit output for summing these outputs together to produce a fourth summing circuit output; and a second storage register connected to said fourth summing circuit output.

10. The apparatus of claim 9 wherein said first and said second multipliers are Galois field multipliers.

11. A method of encoding blocks of data to generate redundancy information according to an 8 bit symbol length code, the 8 bit symbol length code being a Reed-Solomon code characterized by a generator polynomial $g(x)=z^2-\alpha^{152}z+1$, operating over a Galois field having 256 elements, said Galois field being defined by a Galois field generator polynomial $p(x)=x^8+x^4+x^3+x^2+1$ and a primitive alpha elemnent equal to 02x (hexadecimal), the method comprising the steps of:

(a) receiving data blocks comprising a multiplicity of 16 bit data words into an encoder;

(b) providing first and second parallel input paths, said first and second paths receiving respective first and second symbols of a received data word during a single word clock period;

(c) passing said first and said second symbols through corresponding first and second parallel circuit paths of said encoder during a single word clock period; and (d) generating redundancy information from said encoder representative of said data blocks in accordance with the symbol length code after said series of data words has been passed through said encoder.

12. The method of claim 11 wherein said symbol length code is a data integrity code that protects data blocks stored in a block buffer memory in a data channel.

13. The method of claim 12 wherein said data channel is in a disk drive storage device.

14. The method of claim 13 wherein the block of data comprises 512 bytes.

15. A method of encoding block formatted data received by an encoder as a series of 16 bit data words according to an 8 bit symbol length Reed-Solomon code characterized by a generator polynomial $g(x)=z^2-\alpha^{152}z+1$, operating over a Galois field having 256 elements, said Galois field defined by a Galois field generator polynomial $p(x)=x^8+x^4+x^3+x^2+1$ and a primitive alpha element equal to 02x (hexadecimal), the method comprising the steps of:

(a) transmitting data words of a data block to an input of an encoder circuit;

(b) providing a clocking signal to said encoder such that said encoder circuitry operates at one-half the rate associated with a symbol rate of the symbol length code;

(c) splitting said transmitted data words into first and second data symbols;

(d) transmitting said first and second data symbols over first and second parallel paths within said encoder circuit, each of said first and second paths providing a data path to a storage register, each storage register updated with a new storage value directly from the corresponding data path during each word clock period; and (e) outputting generated redundancy information from said storage registers after said series of data words has been passed through said encoder, said generated redundancy formed in accordance with the symbol length code.

16. The method of claim 14 wherein said symbol length code is a data integrity code that protects data blocks stored in a block buffer memory in a data channel.

17. The method of claim 15 wherein said data channel is in a disk drive storage device.

18. The method of claim 16 wherein the block of data comprises 512 bytes.

* * * * *